(12) United States Patent
Li et al.

(10) Patent No.: US 7,968,439 B2
(45) Date of Patent: Jun. 28, 2011

(54) PLASMA IMMERSION ION IMPLANTATION METHOD USING A PURE OR NEARLY PURE SILICON SEASONING LAYER ON THE CHAMBER INTERIOR SURFACES

(75) Inventors: Shijian Li, San Jose, CA (US); Kartik Ramaswamy, San Jose, CA (US); Hiroji Hanawa, Sunnyvale, CA (US); Seon-Mee Cho, Santa Clara, CA (US); Biagio Gallo, Palo Alto, CA (US); Dongwon Choi, Santa Clara, CA (US); Majeed A. Foad, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 784 days.

(21) Appl. No.: 12/069,424

(22) Filed: Feb. 6, 2008

(65) Prior Publication Data

US 2009/0197401 A1      Aug. 6, 2009

(51) Int. Cl.
*H01L 21/425* (2006.01)

(52) U.S. Cl. .................. 438/514; 438/516; 257/E21.057
(58) Field of Classification Search .................. 438/514, 438/516; 257/E21.057
See application file for complete search history.

(56) References Cited

U.S. PATENT DOCUMENTS

| | | | | |
|---|---|---|---|---|
| 3,904,505 | A * | 9/1975 | Aisenberg ............... | 204/298.04 |
| 6,589,868 | B2 | 7/2003 | Rossman .................. | 438/680 |
| 7,767,561 | B2 * | 8/2010 | Hanawa et al. .......... | 438/514 |
| 2005/0070073 | A1 * | 3/2005 | Al-Bayati et al. ........ | 438/460 |
| 2005/0191827 | A1 | 9/2005 | Collins et al. ........... | 438/513 |
| 2006/0073683 | A1 | 4/2006 | Collins et al. ........... | 438/510 |
| 2008/0286982 | A1 * | 11/2008 | Li et al. ................... | 438/782 |

* cited by examiner

*Primary Examiner* — Jarrett J Stark
(74) *Attorney, Agent, or Firm* — Robert M. Wallace

(57) ABSTRACT

Plasma immersion ion implantation employing a very high RF bias voltage on an electrostatic chuck to attain a requisite implant depth profile is carried out by first depositing a partially conductive silicon-containing seasoning layer over the interior chamber surfaces prior to wafer introduction.

13 Claims, 4 Drawing Sheets

PLASMA IMMERSION ION IMPLANTATION METHOD USING A PURE OR NEARLY PURE SILICON SEASONING LAYER ON THE CHAMBER INTERIOR SURFACES

BACKGROUND

Plasma immersion ion implantation is performed by generating a plasma containing ions of species to be implanted in a semiconductor wafer or workpiece. The plasma may be generated using a plasma source such as a toroidal plasma source at the reactor chamber ceiling. Ion energy sufficient to achieve a desired ion implantation depth profile below the wafer surface is provided by coupling a very high RF bias voltage (e.g., 10 kV to 20 kV) to the semiconductor wafer through an insulated cathode electrode within the wafer support pedestal. If the wafer support pedestal is incorporated within an electrostatic chuck, then the insulated cathode electrode may be a thin metal (e.g., molybdenum) mesh separated from the wafer support surface by a thin (e.g., 1 mm thick) insulation layer. The wafer is electrostatically clamped to the chuck by applying a D.C. clamping or "chucking" voltage to the mesh electrode, to induce a strong electric field across the thin insulation layer under the wafer. A high RF bias voltage (10-20 kV) is required to achieve the desired ion implantation depth profile. The wafer is electrostatically clamped to achieve good temperature control. The RF bias power applied to the wafer to control ion energy or implant depth produces a wafer DC bias voltage. The desired electrostatic wafer clamping voltage is produced by applying a DC voltage to the chuck mesh electrode that differs from the wafer DC bias voltage by an amount equal to the desired clamping voltage. The difference is the wafer clamping DC voltage, which is typically 1-2 kilovolts for a coloumbic chuck and 400-600 Volts for a Johnson-Rahbeck chuck.

The D.C. clamping voltage produces a correspondingly large amount of electrical charge trapped in the interface between the wafer backside and the thin insulation layer. This trapped charge produces a strong attractive force between the wafer and the chuck even after removal of the D.C. chucking voltage. Any attempt to remove the wafer from the chuck without waiting for the trapped charge to dissipate risks breaking the wafer. The problem is that it may take 1-24 hours for the trapped charge to dissipate sufficiently to remove the wafer. This is because the wafer has an insulating (silicon dioxide) layer on its backside and the wafer support surface is covered by an insulating (e.g., silicon dioxide or silicon nitride) seasoning layer. The leakage or neutralization of the trapped charge through these insulating layers is extremely slow. The resulting delay (1-24 hours) from waiting for the dissipation of the trapped charge represents a costly reduction in throughput. There is a need to overcome this limitation on productivity.

SUMMARY

A method is provided for plasma immersion ion implantation of a semiconductor workpiece in a plasma reactor chamber. In one embodiment of the method, prior to introducing the workpiece into the reactor, a partially conductive seasoning film is deposited on interior surfaces of the chamber. In one embodiment, the seasoning film contains silicon, oxygen and hydrogen and has a silicon content of between 70% and 85%. The method further includes electrostatically clamping the workpiece on a workpiece support surface in the reactor chamber by applying an electrostatic clamping voltage to an electrode underlying and insulated from the workpiece support surface, and then generating a plasma in the chamber from a process gas containing species to be ion implanted in the workpiece by coupling RF plasma source power from an RF source power generator to the process gas. The method further includes applying RF bias power from an RF bias power generator to a disk-shaped electrode underlying and insulated from the workpiece and having a circumferential edge underlying a circumferential edge of the workpiece, the RF bias power being sufficient to produce a high RF bias voltage on the workpiece on the order of 5-20 kV corresponding to a desired ion implantation depth profile below the surface of the workpiece of the species to be implanted. In one embodiment, the electrostatic clamping voltage is on the order of or exceeds a D.C. component of the RF bias voltage. Thereafter, the workpiece is removed by turning off the clamping voltage, waiting for electrical discharge of the workpiece through a portion of the seasoning film covering the workpiece support surface, and thereafter lifting the workpiece from the workpiece support surface.

DETAILED DESCRIPTION

Figure 1:
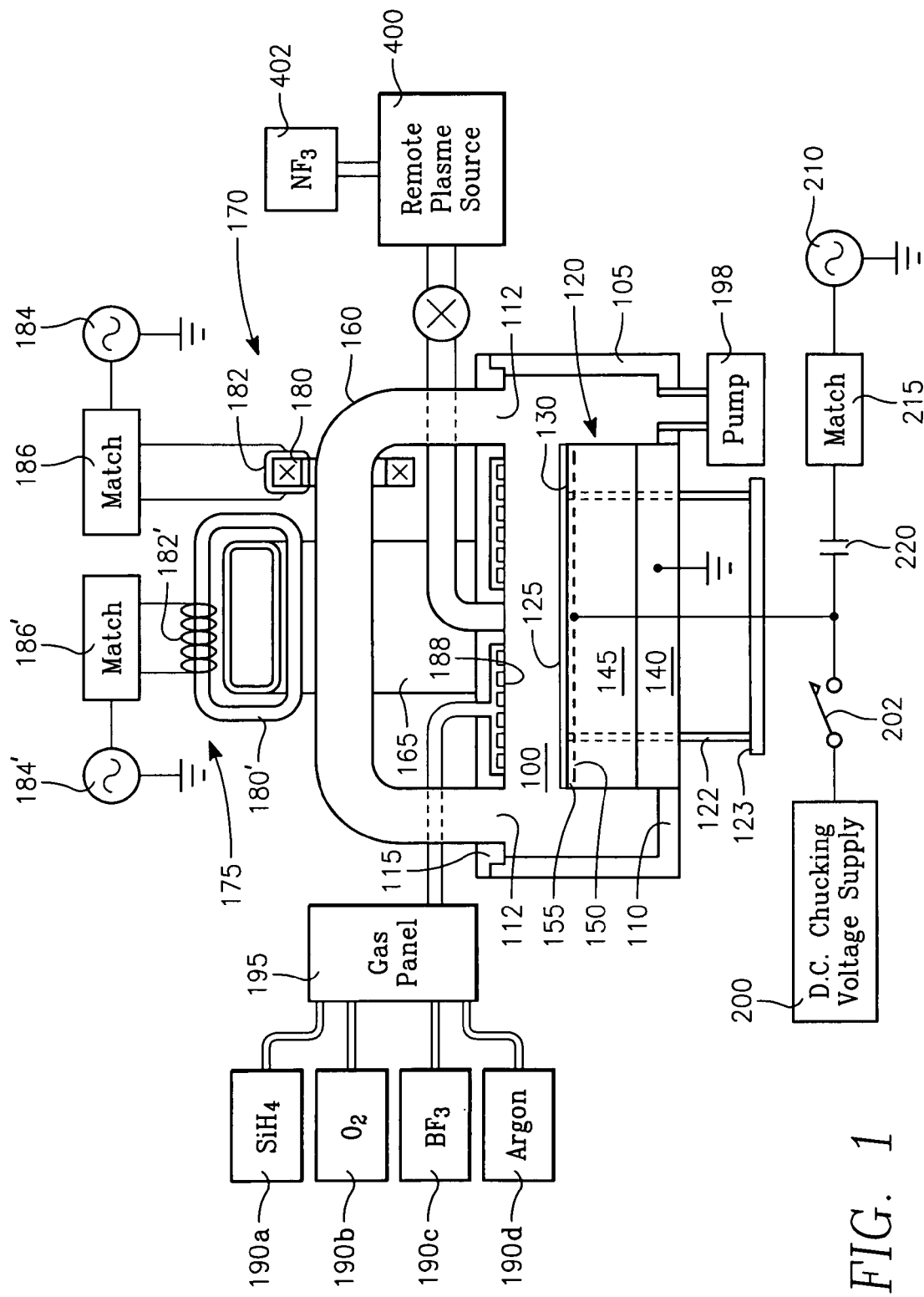
FIG. 1 illustrates a plasma immersion ion implantation reactor employed in carrying out embodiments of a process disclosed herein.

Referring now to FIG. 1, a plasma immersion ion implantation reactor has a chamber 100 enclosed by a cylindrical side wall 105, a floor 110 and a ceiling 115. A wafer support pedestal 120 within the chamber 100 may be an electrostatic chuck capable of electrostatically clamping a semiconductor wafer 125 onto a wafer support surface 130 of the chuck 120. The chuck 120 may consist of a grounded conductive base layer 140, an insulating layer 145 overlying the base layer 140, a thin cathode electrode 150 overlying the insulating layer 145, and a top insulating layer 155 overlying the cathode electrode 150 and forming the wafer support surface 130. The material of the insulating layers 145, 155 may be a ceramic material. The cathode electrode 150 may be a thin metallic mesh formed of molybdenum.

The reactor of FIG. 1 has a toroidal plasma source including a pair of transverse external reentrant conduits 160, 165 each extending across the diameter of the chamber 100 and coupled at their ends to the interior of the chamber 100 through ports 112 in the ceiling 115. RF power applicators 170, 175 couple RF power into the interior of the reentrant conduits 160, 165 respectively. The RF power applicator 170 consists of a magnetically permeable ring 180 wrapped around the conduit 160, a conductive coil 182 wrapped around a portion of the ring 180 and an RF power generator 184 coupled to the coil 182 through an RF impedance match element 186. The RF power applicator 175 consists of a magnetically permeable ring 180' wrapped around the conduit 165, a conductive coil 182' wrapped around a portion of the ring 180' and an RF power generator 184' coupled to the coil 182' through an RF impedance match element 186'.

The ceiling 115 includes a gas distribution plate 188. Process gas supplies 190a, 190b, 190c, 190d furnish process gas through a user-controllable gas panel 195 to the gas distribution plate 188. The chamber 100 is evacuated by a vacuum pump 198. The process gas supplies are capable of furnishing two different mixtures. A first process gas or gas mixture is employed in a pre-implant chamber seasoning process in which a thin coating of a process-compatible material is deposited on the interior surfaces of the reactor chamber prior to introduction of the wafer into the chamber. In one embodiment, the first process gas consists of a mixture of a silicon-containing gas such as silane and oxygen gas. The gas supply 190a may contain the silane gas while the gas supply 190b may contain the oxygen gas. A second process gas or gas mixture is employed during plasma immersion ion implantation of the wafer, the second process gas consisting of a fluoride or hydride of a chemical species (e.g., boron, arsenic, phosphorous, antimony, or the like) to be implanted in the silicon wafer as a semiconductor dopant impurity. The second process gas is dissociated in the plasma to produce ions of the desired dopant species. The second process gas is obtained from the gas supply 190c, which may store a fluoride of a dopant, such as $BF_3$, or a hydride of a dopant, for example. The dopant species may be a p-type dopant for silicon, such as boron or phosphorus for example, or an n-type dopant for silicon, such as arsenic or antimony for example. The gaseous fluoride and hydride compounds of these dopant species are well-known, and it is one of these gaseous compounds that is stored in the gas supply 190c. A specific example of such a gas is $BF_3$. The gas supply 190d contains an inert gas such as argon, for example, whose use is described below in this specification.

The electrostatic chuck 120 includes a set of elevatable lift pins 122 supported on a user-controlled lift spider 123 to enable a robot handler (not shown) to handle the wafer 125 during placement of the wafer onto the support surface 130 and removal of the wafer 125 from the chamber 100. The lift pins 122 are typically formed of a ceramic material to avoid contamination during plasma processing. A user-controllable D.C. chucking voltage supply 200 is connected through a switch 202 to the mesh electrode 150. An RF bias power generator 210 capable of generating extremely high RF bias voltages is coupled to the mesh electrode 150 through an RF impedance match circuit 215 and through an optional isolation capacitor 220 (which may be included in the impedance match circuit 215). In order to provide a useful ion implantation depth profile in the wafer 125, the RF bias voltage generator is operated at a sufficiently high power level to produce an RF bias voltage across the plasma sheath at the wafer surface, which is on the order of 10 kV or more. This voltage controls the ion implantation depth profile.

As referred to above, a pre-implant chamber seasoning process may be performed prior to introduction of the wafer 125, in which at least nearly all the interior chamber surfaces, including the wafer support surface 130, are coated with a seasoning layer consisting of a process-compatible material. This step can prevent contamination of the implant process due to sputtering of process-incompatible materials from the chamber surfaces, for example. Typically, the process-compatible material of the seasoning layer is silicon dioxide or silicon nitride, which adheres well to the chamber interior surfaces. (Pure silicon cannot be employed as the seasoning layer because it adheres poorly.) The silicon dioxide seasoning layer has an electrical resistivity on the order of $10^{12}$ $\Omega$-m. In the pre-implant chamber seasoning process, prior to wafer introduction, silane and oxygen gases are introduced into the chamber 100 through the overhead gas distribution plate 188 from the gas supplies 190a, 190b, while the toroidal plasma source generates a plasma within the chamber 100. The proportion of the silane and oxygen gases is selected to produce a hydrogenated silicon dioxide film on the chamber interior surfaces. This film has a stochiometry similar to that of silicon dioxide, but with some hydrogen present in a small proportion, with an electrical resistivity similar to that of silicon dioxide (about $10^{12}$ $\Omega$-m)

After the chamber surfaces have been coated with the seasoning layer to a desired thickness (e.g., 1-100 microns), the flow of the seasoning process gases (silane and oxygen) to the gas distribution plate 188 is halted by the gas panel 195, allowing these gases to be pumped out of from the interior of the chamber 100. The semiconductor wafer 125 is placed on the wafer support surface 130 of the electrostatic chuck 120, and the ion implantation process gas (e.g., $BF_3$) is introduced from the gas supply 190c through the gas distribution plate 188. The ion implantation process gas may be a fluoride of a dopant or a hydride of a dopant. The term dopant as employed herein refers to impurity species in a semiconductor crystal that form donor or acceptor sites in the semiconductor crystal lattice. For crystalline silicon semiconductor, dopant species include boron, phosphorus, arsenic, antimony, etc. A plasma is generated within the chamber 100 by the toroidal plasma source by RF power from the RF power applicators 170, 175. A desired ion implant depth profile is below the surface of the wafer 125 is obtained by applying a sufficient amount of RF bias power from the RF bias power generator 210 to the cathode electrode 150. Typical ion implant depth profiles require an RF bias voltage on the order of 10 kV-20 kV. The ion implantation process is carried out until a desired ion implant dosage has been attained in the semiconductor wafer 125, after which the wafer is removed from the chamber 100. Removal of the wafer 125 is accomplished by turning off the D.C. chucking voltage supply switch 202 (to remove the electrostatic wafer clamping force), and then elevating the lift pins 122.

The seasoning film is removed from the interior chamber surfaces after at least one or a succession of several wafers have been ion implanted and removed from the chamber. In order to remove the seasoning film, a down-stream or remote plasma source (RPS) 400 is coupled to the gas distribution plate 188 of the chamber 100. A supply 402 of a fluorine-containing gas such as NF3 is coupled to the RPS 400 to produce free fluorine from dissociation in a plasma generated inside the RPS 400. The plasma by-products including the free fluorine are fed as a gas from the RPS 400 through the overhead gas distribution plate 188 and into the chamber 100 to remove the seasoning layer. This removal step requires roughly a half minute to complete.

A problem has arisen in which the semiconductor wafer 125 cannot be removed from the electrostatic chuck 120 without breaking the wafer. We have found that during wafer removal, elevation of the lift pins 122 is opposed by a residual electrostatic wafer clamping force remaining after removal of the D.C. chucking voltage. Typically, the wafer breaks as soon as the lift pins 122 are forced against the wafer backside. This problem is avoided only by postponing wafer removal by an extremely long time after turning off the chucking voltage supply switch 202. This delay may be from one hour to many hours for each wafer, which imposes an unacceptable loss of productivity. We have discovered that this extreme delay arises from two causes. First, the very high D.C. chucking voltage required in the presence of the extremely high RF bias voltage accumulates a proportionately large amount of electrical charge in the wafer-chuck interface. Secondly, the silicon dioxide or silicon nitride seasoning layer increases the electrical isolation of the trapped electrical charge in the wafer-chuck interface. Typically, the wafer has an insulating silicon dioxide film on its backside, and the insulation of the wafer backside silicon dioxide layer and the silicon dioxide seasoning layer on the wafer support surface 130 of the chuck 120 are the main paths for discharge of the trapped charge. Both layers have a high electrical resistivity (e.g., about $10^{12}$ Ω-m), which increases the time required for the trapped charge to dissipate after the D.C. chucking voltage switch 202 is turned off at the conclusion of the plasma immersion ion implantation process. A plasma such as an argon plasma may be maintained in the chamber 100 after the chuck voltage switch 202 is turned off, in order to provide a conductive path for the trapped charge. Even with this expedient, the wait time for wafer removal following chuck voltage switch turn off is on the order of hours.

Another expedient for shortening this delay time is to form the lift pins 122 of metal, and gently place them against the wafer backside to provide another conductive path for discharge of the trapped charge prior to lifting the wafer 125 from the chuck 120. However, lift pins 122 cannot be conductive because the extremely high RF bias voltage (10 kV) applied to the chuck 120 can lead to metallic contamination of the plasma from the lift pins. The lift pins 122 are typically formed of a ceramic material similar to that of the chuck insulating layers 145, 155, and therefore provide no electrical discharge path for the trapped charge at the wafer-chuck interface.

In order to overcome the foregoing problems, a much less electrically resistive material is employed as the seasoning layer deposited on the chamber interior surfaces, having an electrical resistivity on the order of approximately $10^9$ Ω-m, or several orders of magnitude less than that of the silicon dioxide seasoning layer described above. The new less resistive seasoning material, in one embodiment, is formed of about 70-85% silicon by atomic composition and the remainder oxygen and hydrogen. For example, the seasoning layer may be $Si_xO_yH_z$, where x is in a range of 0.7 to 0.85. In another embodiment, the silicon content is in the range of 75% to 85%. In yet another embodiment, the silicon content is in the range of 80% to 85%. Essentially, the proportion of silicon in the partially conductive seasoning material is close to but below a maximum threshold (e.g., about 85% by atomic composition) above which the seasoning material is rendered powdery and adheres poorly to the chamber interior surfaces. Moreover, the proportion of silicon in the partially conductive seasoning layer is above a minimum threshold (about 65% by atomic composition) below which the electrical resistivity of the material exceeds about $10^9$ Ω-m or $10^{10}$ Ω-m. The proportion of oxygen depends upon the proportion of silicon and may be between about 20% and 5%. The remainder of the material consists of hydrogen, so that its range is about 5% to 20%. These proportions can be attained using the following flow rates, in one example: 200-400 sccm of silane and 50-100 sccm of oxygen.

The new partially conductive seasoning material has provided a dramatic increase in productivity (by reducing the required post clamping wait time for wafer lift) without introducing a particle contamination problem to the ion implantation process. In fact, the wait time for wafer lift following removal of the D.C. clamping voltage is now a matter of seconds, which is an improvement of several orders of magnitude over the current wait time of a few hours or more. The new partially conductive seasoning material provides a discharge path for the charge trapped in the wafer-chuck interface having about a thousand times the conductivity of the conventional seasoning material.

The new partially conductive seasoning material is particularly compatible with the toroidal plasma source of the reactor of FIG. 1. Specifically, little or no seasoning material is deposited on the interior surfaces of the reentrant conduits 160, 165 so that its partially conductive behavior does not adversely affect the performance of the RF power applicators 170, 175. Deposition of the partially conductive seasoning material is principally confined to the interior surfaces of the chamber 100.

Figure 2:
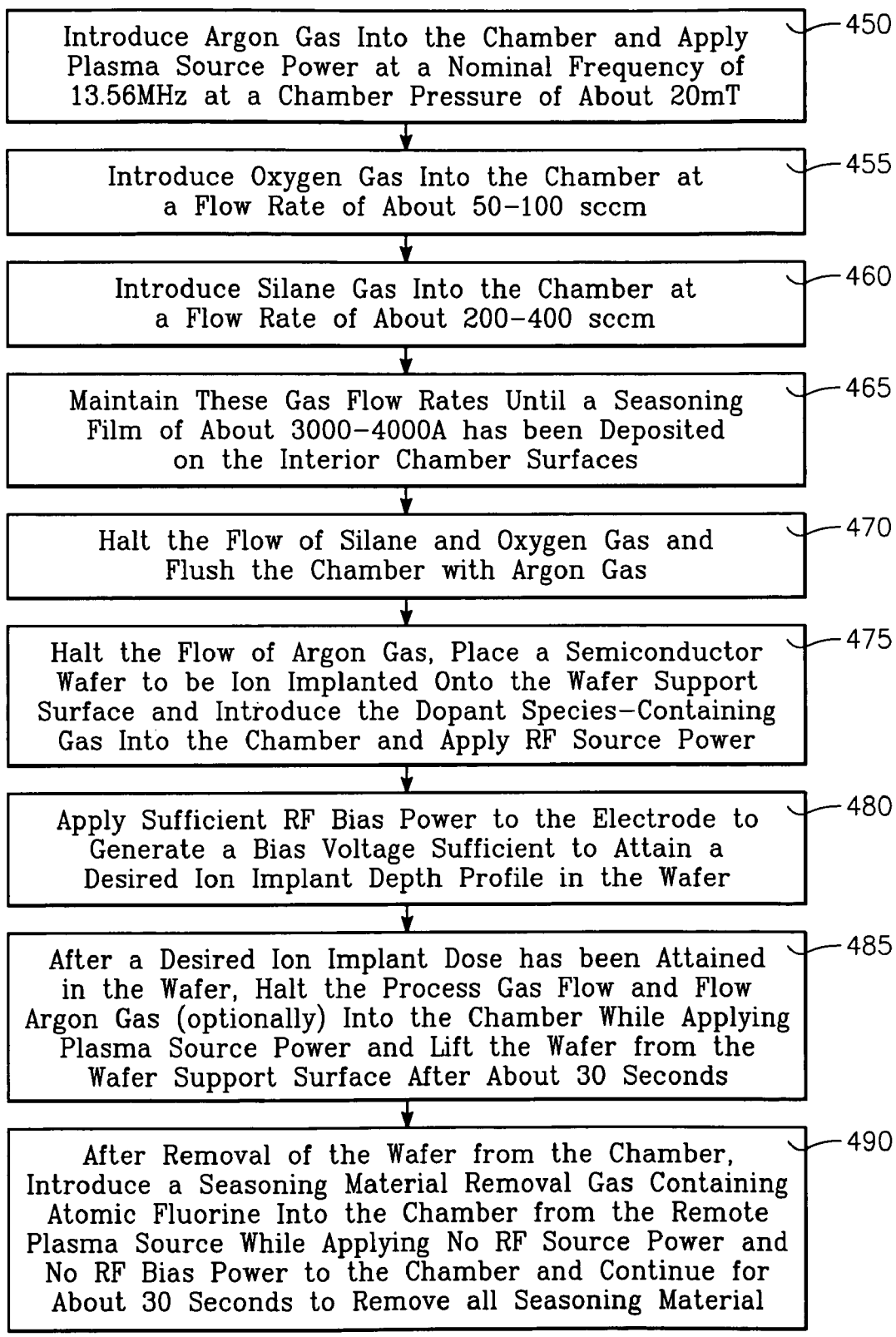
FIG. 2 depicts a process in accordance with one embodiment.

The plasma immersion ion implantation process employing the new partially conductive seasoning material is now described with reference to FIG. 2. First, the new partially conductive seasoning material is deposited on the chamber interior surfaces. For this purpose, argon gas or other inert gas is introduced from one of the gas supplies (e.g., gas supply 190d) through the gas distribution plate 188, while plasma source power is applied by the RF power applicators 170, 175 (block 450) at a nominal frequency of 13.56±1 MHz at a chamber pressure of about 20 mT (block 450). Oxygen gas is introduced through the gas distribution plate 188 at a flow rate of about 50-100 sccm (block 455). Silane gas is introduced through the gas distribution plate 188 at a flow rate of about 200-400 sccm (block 460). These gas flow rates are maintained until a seasoning film of about 3000-4000 Å has been deposited on the interior chamber surfaces (block 465).

The flow of silane gas and oxygen gas is halted and the chamber 100 is flushed with argon gas (block 470). After the argon gas flow is halted, a semiconductor wafer to be ion implanted is placed on the wafer support surface 130 and a dopant species-containing process gas is introduced into the chamber 100 through the gas distribution plate 188 while applying RF source power via the source power applicators 170, 175 (block 475). Sufficient RF bias power (e.g., tens of thousands of Watts) is applied to the electrode 150 to generate a bias voltage (e.g., 10-20 kV) capable of attaining a desired ion implant depth profile in the wafer (block 480).

After a desired ion implant dose has been attained in the wafer, the dopant-containing process gas flow is halted, the clamping voltage switch 202 is turned off, and (optionally) argon (or other inert) gas is flown into the chamber while applying plasma source power via the power applicators 170, 175, and the wafer is lifted from the wafer support surface 130 after about 30 seconds (block 485).

After removal of the wafer from the chamber, a seasoning material removal gas containing (in one embodiment) atomic fluorine is introduced into the chamber through the gas distribution plate 188 from the remote plasma source 400, while applying no RF source power and no RF bias power to the chamber 100. This gas flow is continued for about 30 seconds to remove all seasoning material (block 490). During this time, the vacuum pump 198 maintains the main chamber 100 at about 200-300 mT while maintaining the interior of the remote plasma source 400 at a higher pressure (e.g., 1-2 Torr) by reason of the pressure drop across the gas distribution plate 188 and gas line coupling the remote plasma source 400 to the gas distribution plate. The chamber 100 is then ready for the next plasma immersion ion implantation process. More than one wafer may be ion implanted before the seasoning layer is removed in this manner. One advantage of employing atomic fluorine or fluorine compounds as the seasoning layer removal gas or plasma by-products from the remote plasma source 400 is that fluorine neutrals do not attack aluminum at room temperature to any appreciable degree. This avoids degradation of metal components exposed during removal of the seasoning layer.

Figure 3A:
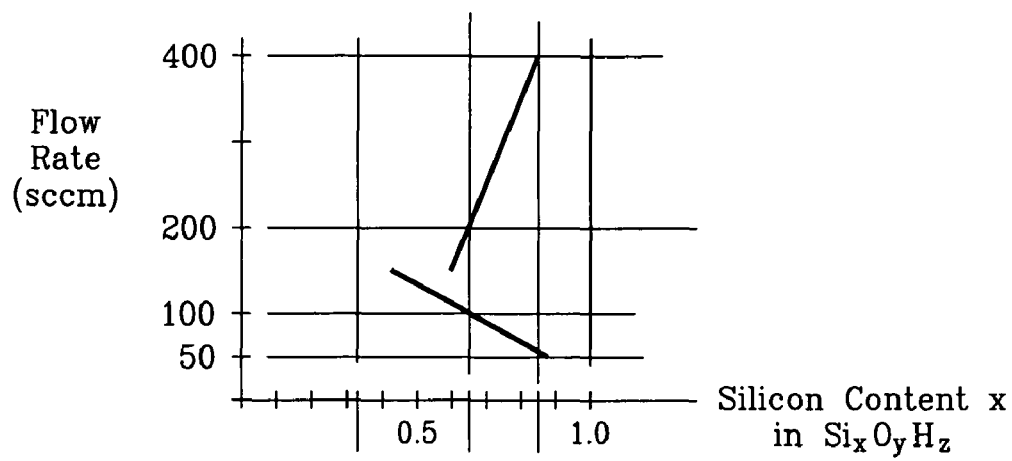
FIG. 3A is a graph depicting the relationship between silane gas flow rate and silicon content of the seasoning layer.
Figure 3B:
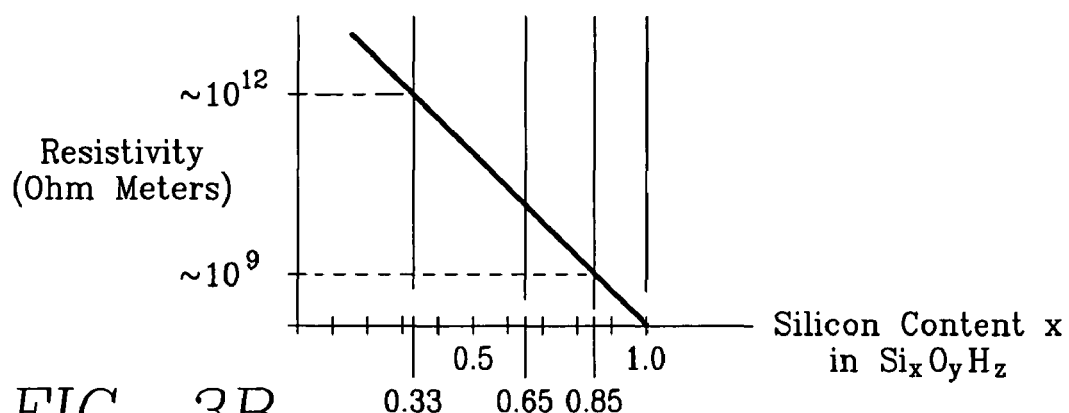
FIG. 3B is a graph depicting electrical resistivity of the seasoning layer as a function of silicon content of the seasoning layer.
Figure 3C:
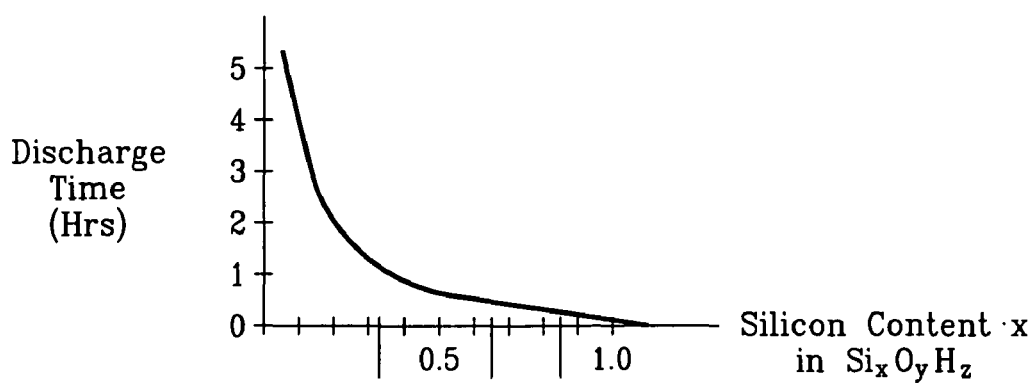
FIG. 3C is a graph depicting the discharge time of the electrical charge trapped in the wafer-chuck interface as a function of silicon content of the seasoning layer.
Figure 3D:
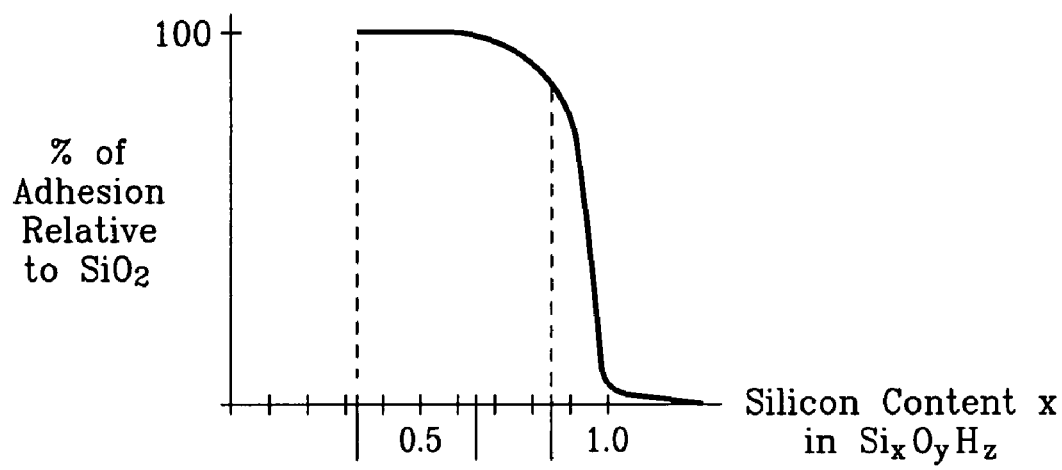
FIG. 3D is a graph depicting percentage of adhesion of the seasoning layer during an ion implantation process relative to adhesion of a silicon dioxide seasoning layer, as a function of silicon content.
Figure 4:
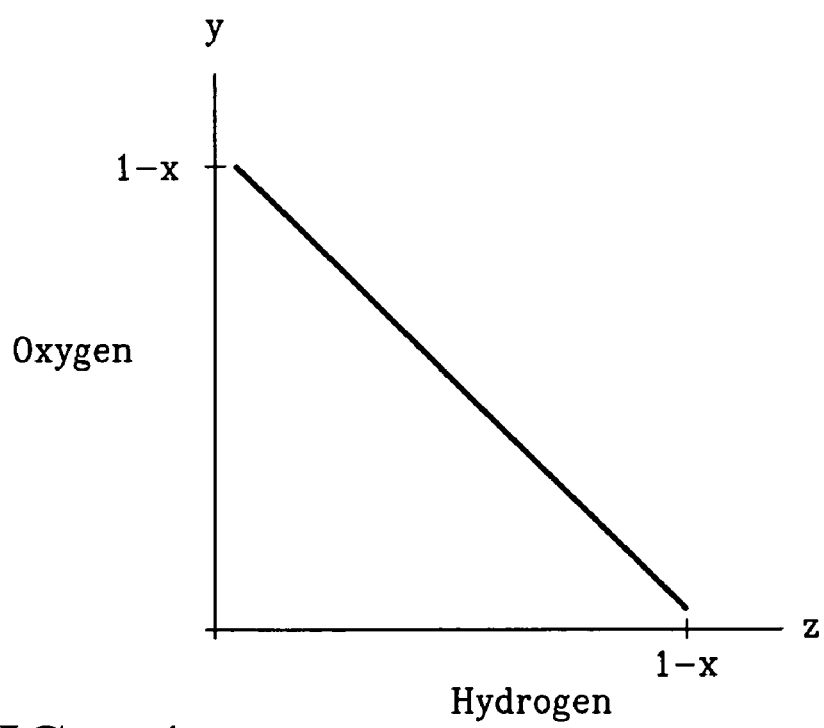
FIG. 4 depicts the relationship between the oxygen and hydrogen content of the seasoning layer for a given silicon content.

FIG. 3A is a graph depicting the silicon content x in a seasoning layer of $Si_xO_yH_z$ as an approximate function of silane gas flow rate in one plasma reactor. The graph of FIG. 3A is approximate and not to scale. In this example, oxygen is supplied into the reactor chamber at a gas flow rate within a particular range (e.g., 50-100 sccm or standard cubic centimeters per minute). FIG. 3A shows that as the silane gas flow rate increases from 200 to 400 sccm, the silicon content increases from about 0.65 to about 0.85. FIG. 3B is a graph depicting resistivity of the seasoning layer as an approximate function of silicon content. The graph of FIG. 3B is an approximation and is not to scale. FIG. 3B shows that the resistivity falls from about $10^{12}$ Ω-m to about $10^9$ Ω-m. FIG. 3C is a graph depicting the time to discharge the charge trapped in the wafer-chuck interface as an approximate function of resistivity of the seasoning layer. The graph of FIG. 3C is approximate and not to scale. FIG. 3C indicates that the discharge time decreases from a maximum time of several hours at a silicon content of 0.33 to a minimum time on the order of seconds as the seasoning layer silicon content increases from 0.33 to 1.00. The discharge time falls into the range of several minutes as the silicon content rises above 0.65. FIG. 3D is a graph depicting the percentage of the seasoning layer adhering to the chamber walls during an ion implantation process, (relative to a silicon dioxide seasoning layer) as an approximate function of silicon content. The graph of FIG. 3D is approximate and is not to scale. FIG. 3D shows that adhesion drops dramatically when the silicon content exceeds about 0.85. The graph of FIG. 3C indicates that the silicon content should exceed approximately 0.65 for the discharge time to decrease to on the order of minutes. FIG. 3D shows that adhesion becomes poor above a silicon content of approximately 0.85. Therefore, in one embodiment, the silicon content is confined in a range of about 0.70 to 0.85 in order to realize a very short trapped charge discharge time while maintaining a relatively good adhesion relative to a silicon dioxide seasoning layer. This is accomplished by limiting the silane gas flow rate to about 200-400 sccm, as indicated in FIG. 3A. The oxygen content y and the hydrogen content z may vary, but their sum y+z must be 1−x, as indicated in the graph of FIG. 4. For example, if the silicon content x=0.85, then y+z=0.15.

What is claimed is:

1. A method of performing plasma immersion ion implantation on a semiconductor workpiece in a plasma reactor chamber, comprising:
   prior to introducing the workpiece into the reactor, depositing a partially conductive seasoning film on interior surfaces of said chamber, said seasoning film comprising silicon, oxygen and hydrogen and having a silicon content of between 70% and 85%;
   electrostatically clamping the workpiece on a workpiece support surface in the reactor chamber by applying an electrostatic clamping voltage to an electrode underlying and insulated from the workpiece support surface;
   generating a plasma in the chamber from a process gas containing species to be ion implanted in the workpiece by coupling RF plasma source power from an RF source power generator to said process gas;
   applying RF bias power from an RF bias power generator to a disk-shaped electrode underlying and insulated from the workpiece and having a circumferential edge underlying a circumferential edge of the workpiece, said RF bias power being sufficient to produce a high RF bias voltage on the workpiece on the order of 5-20 kV corresponding to a desired ion implantation depth profile below the surface of said workpiece of said species to be implanted, wherein said electrostatic clamping voltage is on the order of or exceeds a D.C. component of said RF bias voltage; and
   removing said workpiece by turning off said clamping voltage, waiting for electrical discharge of said workpiece through a portion of said seasoning film covering said workpiece support surface, and thereafter lifting said workpiece from said workpiece support surface.

2. The method of claim 1 wherein depositing a seasoning film comprises flowing a sufficient amount of a silicon-containing gas into the chamber whereby silicon content provides an electrical resistivity in said seasoning film on the order of $10^9$ Ω-m.

3. The method of claim 1 further comprising:
   after removal of a workpiece from said workpiece support surface, removing said seasoning film by:
   (a) dissociating a fluorine-containing gas in a plasma generated in a remote plasma source;
   (b) feeding plasma by-products from said remote plasma source into said chamber.

4. The method of claim 3 further comprising refraining from generating a plasma in said chamber during removal of said seasoning film.

5. The method of claim 1 wherein said seasoning film has a silicon content sufficient to provide an electrical resistivity less than about $10^{10}$ Ω-m in the film and which is sufficiently limited to provide adhesiveness similar to that of silicon dioxide.

6. The method of claim 1 wherein depositing a seasoning film comprises flowing a silicon-containing gas and oxygen into said chamber at flow rates of about 200-400 sccm and 50-100 sccm, respectively while applying RF plasma source power to said silicon-containing and oxygen gases.

7. The method of claim 6 wherein RF plasma source power is applied to a pair of mutually transverse external reentrant conduits coupled to pairs of ports separated across a diameter of said workpiece support surface.

8. A method of performing plasma immersion ion implantation on a semiconductor workpiece in a plasma reactor chamber, comprising:
   prior to introducing the workpiece into the reactor, depositing a partially conductive seasoning film on interior surfaces of said chamber, said seasoning film comprising silicon, oxygen and hydrogen and having a silicon content sufficient to provide an electrical resistivity less than about $10^{10}$ Ω-m in the film and which is sufficiently limited for said film to deposit as a non-powdery solid coating;
   electrostatically clamping the workpiece on a workpiece support surface in the reactor chamber by applying an electrostatic clamping voltage to an electrode underlying and insulated from the workpiece support surface;
   generating a plasma in the chamber from a process gas containing species to be ion implanted in the workpiece by coupling RF plasma source power from an RF source power generator to said process gas;
   applying RF bias power from an RF bias power generator to a disk-shaped electrode underlying and insulated from the workpiece and having a circumferential edge underlying a circumferential edge of the workpiece, said RF bias power being sufficient to produce a high RF bias voltage on the workpiece on the order of 5-20 kV corresponding to a desired ion implantation depth profile below the surface of said workpiece of said species to be implanted, wherein said electrostatic clamping voltage is on the order of or exceeds a D.C. component of said RF bias voltage; and removing said workpiece by turning off said clamping voltage, waiting for electrical discharge of said workpiece through a portion of said seasoning film covering said workpiece support surface, and thereafter lifting said workpiece from said workpiece support surface.

9. The method of claim 8 wherein depositing a seasoning film comprises flowing a sufficient amount of a silicon-containing gas into the chamber whereby silicon content provides an electrical resistivity in said seasoning film on the order of $10^9$ Ω-m.

10. The method of claim 8 further comprising:

after removal of a workpiece from said workpiece support surface, removing said seasoning film by:

(a) dissociating a fluorine-containing gas in a plasma generated in a remote plasma source;

(b) feeding plasma by-products from said remote plasma source into said chamber.

11. The method of claim 10 further comprising refraining from generating a plasma in said chamber during removal of said seasoning film.

12. The method of claim 8 wherein depositing a seasoning film comprises flowing a silicon-containing gas and oxygen into said chamber at flow rates of about 200-400 sccm and 50-100 sccm, respectively while applying RF plasma source power to said silicon-containing and oxygen gases.

13. The method of claim 12 wherein RF plasma source power is applied to a pair of mutually transverse external reentrant conduits coupled to pairs of ports separated across a diameter of said workpiece support surface.

\* \* \* \* \*